(12) United States Patent
Yoder et al.

(10) Patent No.: US 11,084,955 B2
(45) Date of Patent: Aug. 10, 2021

(54) PRESSURE SENSITIVE ADHESIVE WITH THERMALLY CONDUCTIVE RELEASE TAB

(71) Applicant: Microsoft Technology Licensing, LLC, Redmond, WA (US)

(72) Inventors: Gregory Yoder, Sammamish, WA (US); Randall J. Park, Bothell, WA (US); Jason F. Lee, Lynnwood, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/042,347

(22) Filed: Jul. 23, 2018

(65) Prior Publication Data
US 2020/0024491 A1 Jan. 23, 2020

(51) Int. Cl.
*C09J 7/29* (2018.01)
*H05K 1/02* (2006.01)
(Continued)

(52) U.S. Cl.
CPC .............. *C09J 7/29* (2018.01); *H05K 1/0203* (2013.01); *H05K 1/181* (2013.01);
(Continued)

(58) Field of Classification Search
CPC . C09J 7/29; C09J 7/20; C09J 2301/502; C09J 2301/124; C09J 2301/302; C09J 2203/326; C09J 2400/123; H05K 1/0203; H05K 1/181; H05K 2201/10037; H05K 3/00; H05K 2203/176
See application file for complete search history.

(56) References Cited

U.S. PATENT DOCUMENTS

| 4,184,000 A | 1/1980 | Denman |
| 4,555,607 A | 11/1985 | Roentgen et al. |

(Continued)

FOREIGN PATENT DOCUMENTS

| EP | 3159739 A2 | 4/2017 |
| WO | 2015152906 A1 | 10/2015 |

(Continued)

OTHER PUBLICATIONS

"International Search Report and Written Opinion Issued in PCT Application No. PCT/US2019/037832", dated Oct. 2, 2019, 11 Pages.

(Continued)

*Primary Examiner* — Patricia L. Nordmeyer
(74) *Attorney, Agent, or Firm* — Holzer Patel Drennan

(57) ABSTRACT

Computing devices may require disassembly to repair or replace a defective or damaged component, or to facilitate recycling at the end of the computing device's service life. While pressure sensitive adhesive (PSA) is good at creating secure connections between components within the expected operating conditions of the computing device, PSA resists intentional disassembly of such components. The presently disclosed PSA with thermally conductive release tabs provides a mechanism for effective spot-cooling of the PSA between adhered components. Once the PSA reaches a low temperature threshold, one component may be mechanically separated from another component. This yields potentially faster and easier disassembly of adhered components than prior art techniques.

19 Claims, 6 Drawing Sheets

(51) Int. Cl.
  *H05K 1/18* (2006.01)
  *H05K 3/00* (2006.01)
(52) U.S. Cl.
  CPC .... *C09J 2203/326* (2013.01); *C09J 2301/502* (2020.08); *C09J 2400/123* (2013.01); *H05K 3/00* (2013.01); *H05K 2201/10037* (2013.01); *H05K 2203/176* (2013.01)

(56) References Cited

U.S. PATENT DOCUMENTS

| | | | |
|---|---|---|---|
| 5,100,494 | A | 3/1992 | Schmidt |
| 5,620,794 | A | 4/1997 | Burkart et al. |
| 6,228,965 | B1 | 5/2001 | Muta et al. |
| 6,270,872 | B1 | 8/2001 | Cline et al. |
| 6,555,235 | B1 | 4/2003 | Aufderheide et al. |
| 6,587,097 | B1 | 7/2003 | Aufderheide et al. |
| 6,780,940 | B2 | 8/2004 | Yoshihara et al. |
| 6,855,760 | B1 | 2/2005 | Kirsten et al. |
| 7,000,356 | B2 | 2/2006 | Tamai et al. |
| 7,205,718 | B2 | 4/2007 | Cok |
| 7,411,639 | B2 | 8/2008 | Kim |
| 8,829,556 | B2 | 9/2014 | Aurongzeb et al. |
| 9,540,550 | B2 | 1/2017 | Wu et al. |
| 9,618,973 | B2 | 4/2017 | Bergmann et al. |
| 9,682,451 | B2 | 6/2017 | Podges |
| 9,865,906 | B2 | 1/2018 | Dudley et al. |
| 2010/0021668 | A1 | 1/2010 | Shimokawa et al. |
| 2010/0154992 | A1 | 6/2010 | Feinstein et al. |
| 2010/0175829 | A1 | 7/2010 | Masuda et al. |
| 2010/0213403 | A1 | 8/2010 | Hasegawa et al. |
| 2012/0064338 | A1 | 3/2012 | Niimi et al. |
| 2014/0020845 | A1 | 1/2014 | Scatena et al. |
| 2014/0272332 | A1 | 9/2014 | Reineman et al. |
| 2014/0287299 | A1 | 9/2014 | Krogdahl |
| 2016/0014912 | A1 | 1/2016 | Shih |
| 2016/0152872 | A1 | 6/2016 | Furuta et al. |
| 2016/0377894 | A1 | 12/2016 | Park |
| 2017/0362473 | A1 | 12/2017 | Butterbach et al. |
| 2019/0001654 | A1 | 1/2019 | Bonicatto et al. |

FOREIGN PATENT DOCUMENTS

| | | |
|---|---|---|
| WO | 2016209566 A1 | 12/2016 |
| WO | 2017013914 A1 | 1/2017 |

OTHER PUBLICATIONS

"ElectRelease", Retrieved From http://www.eiclabs.com/ERtech.htm, Retrieved on: May 14, 2018, 2 Pages.

"Notice of Allowance Issued in U.S. Appl. No. 15/639,581", dated Apr. 8, 2019, 10 Pages.

"Final Office Action Issued in U.S. Appl. No. 15/639,581", dated Oct. 5, 2018, 14 Pages.

"Non Final Office Action Issued in U.S. Appl. No. 15/639,581", dated May 23, 2018, 16 Pages.

Kahn, Bruce, "Patterning Processes for Flexible Electronics", In Proceedings of the IEEE, vol. 103, Issue 4, Apr. 2015, pp. 497-517.

"International Search Report and Written Opinion Issued in PCT Application No. PCT/US2018/034501", dated Aug. 31, 2018, 12 Pages.

PRESSURE SENSITIVE ADHESIVE WITH THERMALLY CONDUCTIVE RELEASE TAB

BACKGROUND

Computing devices are often assembled by applying a pressure-sensitive adhesive (PSA) between various components within the device (e.g., a chassis, batteries, display screen, circuit boards, cameras, speakers, microphones, ports, connecting wires and/or traces therebetween, and so on). PSA creates secure connections between components within the device within its expected operating conditions.

However, the computing device may require subsequent disassembly to repair or replace a defective or damaged component, or to facilitate recycling at the end of the computing device's service life. Further, ease of repair and recyclability of computing devices is increasingly important to their manufacturers as governmental entities legislate or otherwise place affirmative requirements on device manufacturers regarding reparability and/or recyclability of their computing devices. Consumer expectations also increasingly expect such device reparability and/or recyclability.

While PSA is good at creating secure connections between components within the expected operating conditions of the computing device, PSA resists intentional disassembly of such components. Various techniques are employed to facilitate causing PSA to release its bond between adhered components for disassembly. For example, the computing device may be placed in a hot chamber or a heat gun is directed at the computing device, which heats the entire computing device (or a large portion thereof) to a temperature that renders the PSA tacky and pliable and more readily able to release its bond between adhered components. However, this is time consuming as it requires the entire device (or a large portion thereof) to reach a desired temperature threshold and such hot temperatures may negatively affect other components of the computing device. Still further, the tacky and pliable PSA, while more readily able to release its bond between adhered components, tends not to release cleanly and may distribute heated PSA onto other components of the computing device during disassembly.

Alternatively, the computing device may be placed in a cold chamber, which cools the entire computing device to a temperature that renders the PSA brittle and also more readily able to release its bond between adhered components. However, the cold chamber is also time consuming as it requires the entire device to reach a desired temperature threshold. Further, such cold temperatures may negatively affect other components of the computing device and weaken other PSA bonds within the computing device.

Further, a solvent (or acid) may be applied to the PSA to partially or fully dissolve the PSA and release its bond between adhered components. However, it may be difficult to effectively apply the solvent to the PSA due to tight clearances within the computing device and the solvent may inadvertently come in contact with other components thereby damaging them. Further still, such solvents are often not very environmentally friendly and may be harmful to a user.

The adhered components may be mechanically pried apart, with or without the aforementioned heating, cooling, and/or application of solvent. However, there is often insufficient room to effectively place a prying structure between the adhered components. To the extent there is sufficient room, mechanically prying apart the adhered components risks deflecting the adhered components and/or other nearby components and damaging them.

As such, there exists a need for an improved technique for disassembly of components adhered together using PSA within a computing device that avoids some, if not all of the disadvantages of current techniques, as described above.

SUMMARY

Implementations described and claimed herein provide a pressure sensitive adhesive comprising a first adhesive layer, a second adhesive layer, and a thermally conductive carrier. The thermally conductive carrier is oriented between the first adhesive layer and the second adhesive layer and the thermally conductive carrier includes a first conductive tab extending beyond a perimeter of at least one of the first adhesive layer and the second adhesive layer.

Implementations described and claimed herein further provide a method of disassembling a computing device comprising contacting a first conductive tab of a pressure sensitive adhesive adhering a first component to a second component with a cold probe, conducting thermal energy from the pressure sensitive adhesive to the cold probe at the first conductive tab, and lifting the first component from the second component.

Implementations described and claimed herein still further provide a computing device comprising a first component, a second component, and a pressure sensitive adhesive. The pressure sensitive adhesive is oriented between the first component and the second component and adheres the first component to the second component. The thermally conductive pressure sensitive adhesive comprises a first adhesive layer, a second adhesive layer, and a thermally conductive carrier oriented between the first adhesive layer and the second adhesive layer. The thermally conductive carrier includes a first conductive tab extending beyond a perimeter of the first component.

Other implementations are also described and recited herein. This Summary is provided to introduce a selection of concepts in a simplified form that are further described below in the Detailed Descriptions. This Summary is not intended to identify key features or essential features of the claimed subject matter, nor is it intended to be used to limit the scope of the claimed subject matter.

BRIEF DESCRIPTIONS OF THE DRAWINGS

DETAILED DESCRIPTIONS

The presently disclosed pressure sensitive adhesive (PSA) with thermally conductive release tabs provides a mechanism for effective spot-cooling of the PSA between adhered components, while substantially insulating other nearby components from the applied cold temperature. Once the PSA reaches a low temperature threshold, the adhered component may be mechanically separated from another component. This yields potentially faster and easier disassembly of adhered components than prior art techniques. Average computing device rework time may drop, and less space and equipment may be required for reworking computing devices.

Figure 1:
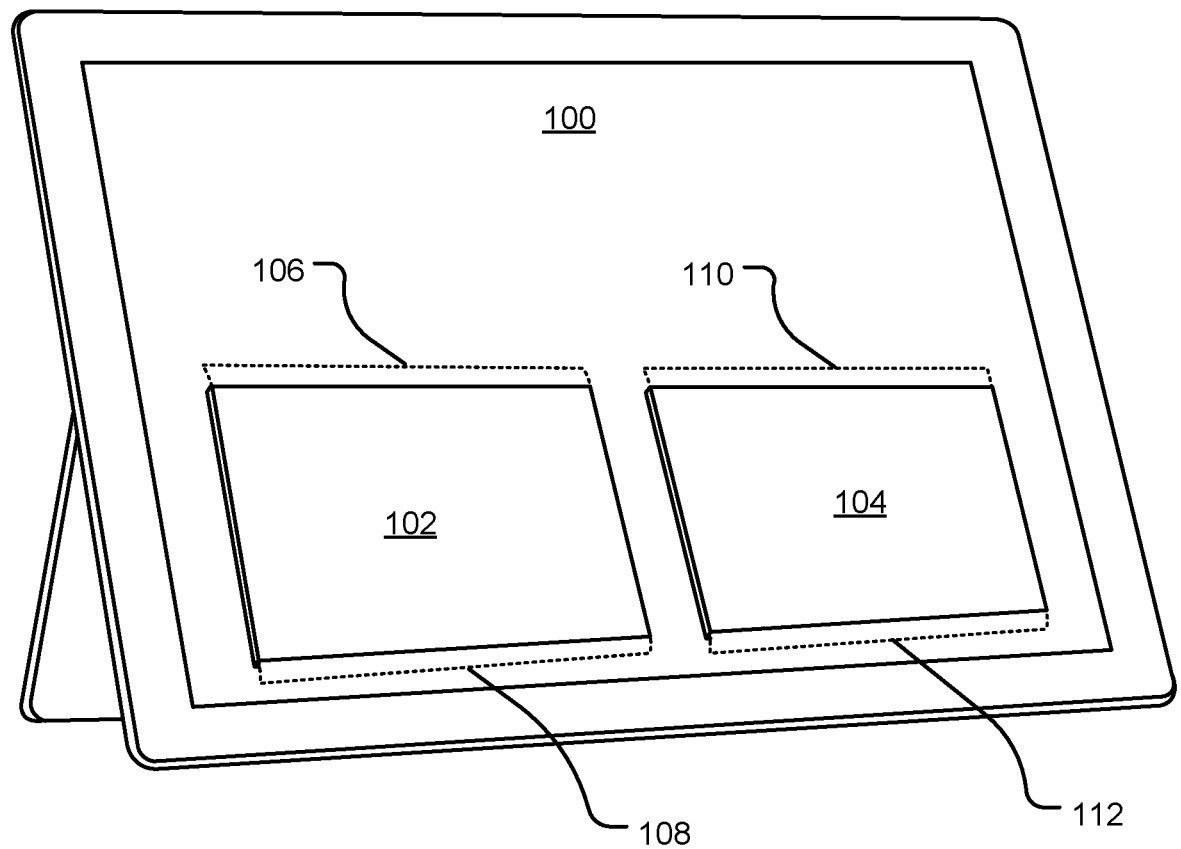
FIG. 1 illustrates a perspective view of an example tablet computer chassis with a pair of batteries adhered to the chassis using a pressure sensitive adhesive (PSA) with thermally conductive release tabs.

FIG. 1 illustrates a perspective view of an example tablet computer chassis 100 (also referred to as a bucket or a mounting structure) with a pair of batteries (or first components) 102, 104 adhered to the chassis (or second component) 100 using a pressure sensitive adhesive (PSA, not shown) with thermally conductive release tabs 106, 108, 110, 112. A cover glass (not shown) typically spans a front-facing surface of the chassis 100 to form the tablet computer, but is omitted in FIG. 1 to illustrate the batteries 102, 104 adhered to the chassis 100 using the PSA. The chassis 100 (e.g., a metallic alloy and/or plastic frame) occupies a rear-facing surface of the tablet computer and serves as a protective cover and mounting structure for internal components (e.g., structural framework, printed circuit boards, microprocessors, integrated circuits, electronic storage devices, cooling components, cameras, antennas, speakers, microphones, and batteries). In various implementations, additional components may also be adhered to the chassis, the cover glass, or each other using the PSA.

The PSA is an adhesive that forms a bond between components when a compressive force is applied. Typically, no solvent, water, or heat is required to activate the adhesive. The strength of the bond is at least in part controlled by the amount of compressive force applied to adhere the components. The PSA is designed to adequately bond and maintain a bond within a predetermined effective temperature range corresponding to expected operating conditions of an associated computing device (e.g., the tablet computer). Temperatures above the effective temperature range may cause the PSA to lose its shear holding capability and become pliable, while temperatures below the effective temperature range may cause the PSA to lose its tackiness and become brittle.

The PSA is also thermally conductive by virtue of an at least 3-layer construction, including two adhesive layers and a conductive carrier oriented therebetween. The adhesive layers may be made of a variety of suitable adhesives (e.g., elastomers, acrylics, natural or synthetic rubbers, ethylene-vinyl-acetate, nitriles, and styrene copolymers) with or without a suitable added tackifier (e.g., rosin esters and silicone resins). The conductive carrier may be made of a variety of suitable thermally conductive materials (e.g., compressed graphite, graphene, metal alloys (such as a copper alloy), carbon, carbides, and nitrides). The conductive carrier may also be formed in a continuous sheet of conductive material, or a powder held to a sheet-like shape between additional carrier layers. In further implementations, the PSA includes additional layers of adhesive and/or carrier material (e.g., plastics, such as thin mylar sheets holding the conductive carrier and/or adhesive layers together). Still further, each of the adhesive layers may include multiple sublayers of adhesive and/or carrier material(s). Further still, the thermally conductive carrier may include multiple sublayers of conductive and binding materials.

The PSA adhering the batteries 102, 104 to the chassis 100 includes thermally conductive release tabs 106, 108, 110, 112. More specifically, thermally conductive release tabs 106, 108 are associated with battery 102, while thermally conductive release tabs 110, 112 are associated with battery 104. Each of the batteries 102, 104 have a perimeter defined by their physical extents to be adhered to the chassis (illustrated by solid lines). The PSA occupies an underside surface area of the batteries 102, 104 (not shown) within the perimeter, and also extends beyond the perimeter to form the thermally conductive release tabs 106, 108, 110, 112 (illustrated by dotted lines). The thermally conductive release tabs 106, 108, 110, 112 may be used to conduct thermal energy out of the PSA during a disassembly process, as described in further detail below.

In an example implementation, the thermally conductive release tabs 106, 108, 110, 112 are each 200 μm to 300 μm thick, 4 mm to 5 mm wide, and in total occupy approximately 10% to 90% of the perimeter of each of the batteries 102, 104. Here, the thermally conductive release tabs 106, 108, 110, 112 each occupy one of four total sides of the perimeter of each of the batteries 102, 104. In other implementations, the thermally conductive release tabs 106, 108, 110, 112 may occupy less than the entirety of one side of the perimeter of each of the batteries 102, 104 and there may be multiple distinct conductive release tabs on a side of the batteries 102, 104. Further, the conductive release tabs 106, 108, 110, 112 may have different sizes than that described above and may take on different shapes than that depicted in FIG. 1. Still further, the conductive release tabs 106, 108, 110, 112 may have the same or differing sizes and shapes.

In addition to the aforementioned benefits as to disassembly of the tablet computer, in various implementations, the conductive carrier of the PSA adhering the batteries 102, 104 to the chassis 100 may serve to facilitate thermal transfer to the chassis 100 during operation of the tablet computer. As the batteries 102, 104 may generate heat during operation, and can degrade at a higher rate when maintained at higher temperatures, using the conductive carrier of the PSA to dissipate thermal energy may increase expected life of the batteries 102, 104. In further implementations, to the extent the PSA described in detail here is used to adhere other heat-generating components to thermal sinks, such as the chassis 100, the conductive carrier of the PSA may also serve to dissipate thermal energy from such heat-generating components.

While the tablet computer is illustrated in FIG. 1 and described in detail above, the PSA with thermally conductive release tabs 106, 108, 110, 112, or other thermally conductive release tabs described herein, may be incorporated into a variety of other computing devices that include batteries or other components adhered together using a PSA (e.g., laptop computers, personal computers, gaming devices, smart phones, or other devices that carry out one or more specific sets of arithmetic and/or logical operations) having a variety of physical forms, including various sizes and shapes.

Figure 2:
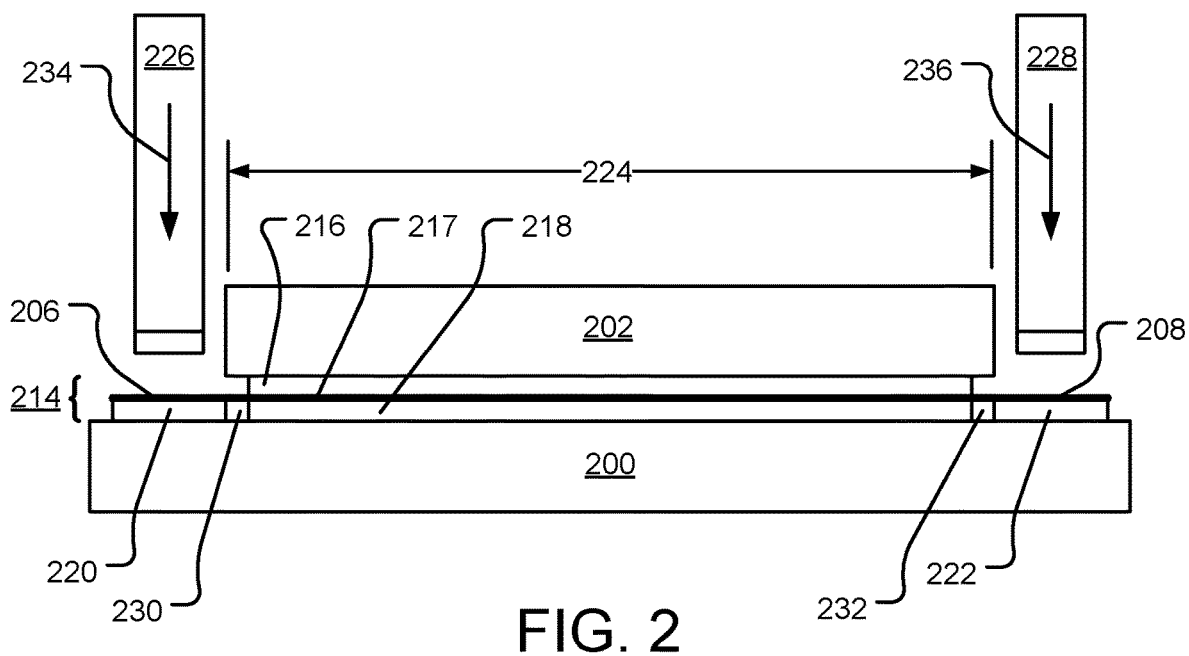
FIG. 2 illustrates a sectional elevation view of an example tablet computer chassis with a component adhered to the chassis using a PSA with thermally conductive release tabs.

FIG. 2 illustrates a sectional elevation view of an example tablet computer chassis 200 with a battery (or first component) 202 adhered to the chassis (or second component) 200 using a PSA 214 with thermally conductive release tabs 206, 208. The chassis 200 may be a bucket or other mounting structure within the tablet computer, including a surface of another component within the tablet computer. The first component 202 may be a battery, or any other component to be adhered to the chassis 200 within the tablet computer using the PSA 214.

The PSA 214 is at least a 3-layer construction, including two adhesive layers 216, 218 and a conductive carrier 217 oriented therebetween. The adhesive layers 216, 218 may be made of a variety of suitable adhesives (with or without an added tackifier) and the conductive carrier 217 may be made of a variety of suitable thermally conductive materials. In further implementations, the PSA 214 includes additional layers of adhesive or carrier material. In general, the first adhesive layer 216 serves to adhere the first component 202 to the conductive carrier 217, while the second adhesive layer 218 serves to adhere the chassis 200 to the conductive carrier 217. The conductive carrier 217 serves as a conductive path for pulling thermal energy out of the PSA 214 via the thermally conductive release tabs 206, 208. The first component 202 has a perimeter 224 defined by its physical extents to be adhered to the chassis 200. More specifically, the perimeter 224 is defined by width and length dimensions of the first component 202 (assuming a rectangular shaped component 202, only one dimension of which is depicted in FIG. 2). The PSA 214 occupies an underside surface area of the first component 202 within the perimeter 224, and also extends beyond the perimeter 224 to form the thermally conductive release tabs 206, 208.

Each of the adhesive layers 216, 218 may also have a perimeter that may or may not coincide with the perimeter 224 of the first component 202. For example, in FIG. 2 the perimeter of each of the adhesive layers 216, 218 is illustrated as largely the same as the perimeter 224 of the first component 202, albeit a bit smaller (or less than 5% smaller). The PSA 214, particularly the conductive carrier 217, may extend beyond a perimeter of one or both of the adhesive layers 216, 218 to form the thermally conductive release tabs 206, 208.

The thermally conductive release tabs 206, 208 may also include thermal insulators (or spacers) 220, 222 that occupy space between the conductive carrier 217 and the chassis 200 in the same plane as the adhesive layer 218. The thermal insulators 220, 222 are thermally insulative and sufficiently rigid to withstand an expected load from cold probes 226, 228 (e.g., nitrogen sticks or other mechanisms for delivering conductive point cooling) without substantial deflection. In various implementations, the thermal insulators 220, 222 may be multilayered (or have sublayers), including a rigid thermally insulative structure bounded by PSA layers to adhere the rigid thermally insulative structure to the chassis 200 and the conductive carrier 217.

The thermal insulators 220, 222 may be made of a variety of suitable thermally insulating and structurally rigid materials (e.g., plastics, such as polyethylene terephthalate and mylar, ceramics, foams, adhesives, and/or composites thereof). In some implementations, the adhesive layer 218 itself is sufficiently thermally insulating and structurally rigid to serve as the thermal insulators 220, 222. In such implementations, the adhesive layer 218 may continuously extend from within the perimeter 224 to outside of the perimeter 224 at the thermally conductive release tabs 206, 208. Still further, while gaps 230, 232 are depicted between the thermal insulators 220, 222 and the adhesive layer 218, the gaps 230, 232 may be of various sizes, or non-existent.

In a disassembly operation, the cold probes 226, 228 are brought into contact with the thermally conductive release tabs 206, 208, respectively, as illustrated by arrows 234, 236, respectively. The cold probes 226, 228 include tips respectively that make thermally conductive contact with the conductive carrier 217 upon contact to selectively conduct thermal energy out of the PSA 214.

While the tablet computer chassis 200 is illustrated in FIG. 2 and described in detail above, the PSA 214 with thermally conductive release tabs 206, 208, or other thermally conductive release tabs described herein, may be incorporated into a variety of other computing devices. Such computing devices may include batteries or other components adhered together using the PSA 214 having a variety of physical forms, including various sizes and shapes. Additional features of the chassis 200, first component 202 and/or PSA 214 may be as described above with reference to FIG. 1, and/or elsewhere herein.

Figure 3:
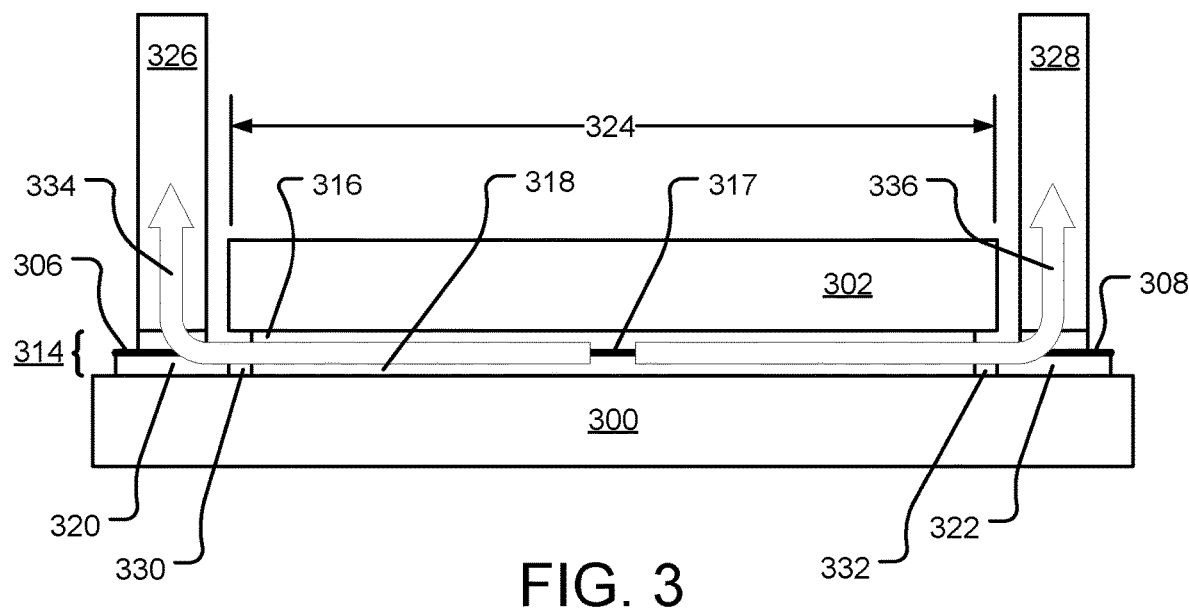
FIG. 3 illustrates a sectional elevation view of an example tablet computer chassis with a component adhered to the chassis using a PSA with thermally conductive release tabs, while thermal energy is conducted away from the PSA.

FIG. 3 illustrates a sectional elevation view of an example tablet computer chassis 300 with a battery (or first component) 302 adhered to the chassis (or second component) 300 using a PSA 314 with thermally conductive release tabs 306, 308, while thermal energy is conducted away from the PSA 314. The chassis 300 may be a bucket or other mounting structure within the tablet computer, including a surface of another component within the tablet computer. The first component 302 may be a battery, or any other component to be adhered to the chassis 300 within the tablet computer using the PSA 314.

The PSA 314 is at least a 3-layer construction, including two adhesive layers 316, 318 and a conductive carrier 317 oriented therebetween. The adhesive layers 316, 318 may be made of a variety of suitable adhesives (with or without an added tackifier) and the conductive carrier 317 may be made of a variety of suitable thermally conductive materials. In further implementations, the PSA 314 includes additional layers of adhesive or carrier material. In general, the first adhesive layer 316 serves to adhere the first component 302 to the conductive carrier 317, while the second adhesive layer 318 serves to adhere the chassis 300 to the conductive carrier 317. The conductive carrier 317 serves as a conductive path for pulling thermal energy out of the PSA 314 via the thermally conductive release tabs 306, 308. The first component 302 has a perimeter 324 defined by its physical extents (e.g., width and length) to be adhered to the chassis 300. The PSA 314 occupies an underside surface area of the first component 302 within the perimeter 324, and also extends beyond the perimeter 324 to form the thermally conductive release tabs 306, 308.

The thermally conductive release tabs 306, 308 may also include thermal insulators (or spacers) 320, 322 that occupy space between the conductive carrier 317 and the chassis 300. The thermal insulators 320, 322 are thermally insulative and sufficiently rigid to withstand an expected load from cold probes 326, 328 without substantial deflection. Gaps 330, 332 are depicted between the thermal insulators 320, 322 and the adhesive layer 318.

The cold probes 326, 328 are in thermally conductive contact with the thermally conductive release tabs 306, 308, respectively, and are maintained at a temperature lower than that of the PSA 314. Thermal energy is conducted from the PSA 314 to the cold probes 326, 328 as illustrated by arrows 334, 336, primarily via the conductive carrier 317. More specifically, the cold probes 326, 328 are maintained at a temperature below that required to cause the PSA 314 to lose its tackiness and become brittle. Further, the expected rate of thermal transfer from the PSA 314 to the cold probes 326, 328 is greater than an expected rate of thermal transfer of heat back into the PSA 314 from the relatively warmer chassis 300 and first component 302, and other surrounding components of the tablet computer, at least until a desired cold temperature is reached within the PSA 314. In an example implementation, the cold probes 326, 328 are maintained at a temperature below −50 degrees Celsius in an effort to draw thermal energy from the PSA 314 at a rate sufficient to uniformly lower the PSA 314 temperature to −30 to −50 degrees Celsius. In some implementations, the temperature required to cause the PSA 314 to lose its tackiness and become brittle is equal to a freezing temperature of constituent viscous semi-liquid components of the PSA 314.

While the tablet computer chassis 300 is illustrated in FIG. 3 and described in detail above, the PSA 314 with thermally conductive release tabs 306, 308, or other thermally conductive release tabs described herein, may be incorporated into a variety of other computing devices. Such computing devices may include batteries or other components adhered together using the PSA 314 having a variety of physical forms, including various sizes and shapes. Additional features of the chassis 300, first component 302 and/or PSA 314 may be as described above with reference to FIGS. 1 and 2, and/or elsewhere herein.

Figure 4:
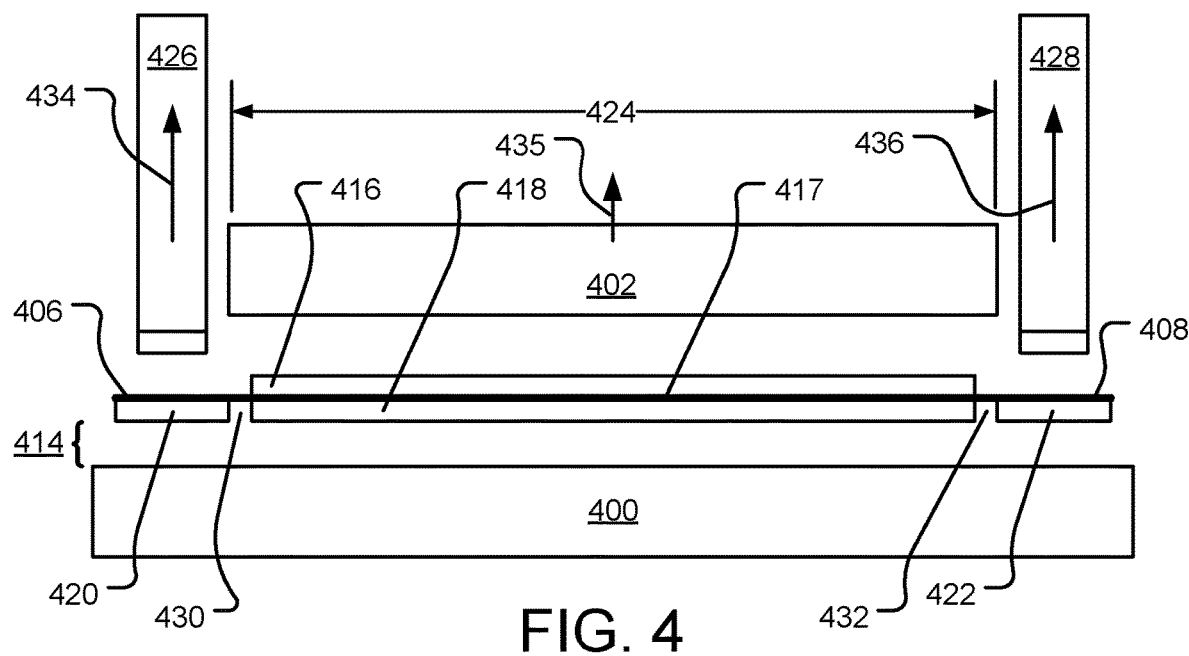
FIG. 4 illustrates a sectional elevation view of an example tablet computer chassis with a component released from the chassis and a PSA with thermally conductive release tabs.

FIG. 4 illustrates a sectional elevation view of an example tablet computer chassis 400 with a battery (or first component) 402 released from the chassis (or second component) 400 and a PSA 414 with thermally conductive release tabs 406, 408. The chassis 400 may be a bucket or other mounting structure within the tablet computer, including a surface of another component within the tablet computer. The first component 402 may be a battery, or any other component to be adhered to the chassis 400 within the tablet computer using the PSA 414.

The PSA 414 is at least a 3-layer construction, including two adhesive layers 416, 418 and a conductive carrier 417 oriented therebetween. The adhesive layers 416, 418 may be made of a variety of suitable adhesives (with or without an added tackifier) and the conductive carrier 417 may be made of a variety of suitable thermally conductive materials. In further implementations, the PSA 414 includes additional layers of adhesive or carrier material. In general, the first adhesive layer 416 serves to adhere the first component 402 to the conductive carrier 417, while the second adhesive layer 418 serves to adhere the chassis 400 to the conductive carrier 417. The conductive carrier 417 serves as a conductive path for pulling thermal energy out of the PSA 414 via the thermally conductive release tabs 406, 408. The first component 402 has a perimeter 424 defined by its physical extents (e.g., width and length) to be adhered to the chassis 400. The PSA 414 occupies an underside surface area of the first component 402 within the perimeter 424, and also extends beyond the perimeter 424 to form the thermally conductive release tabs 406, 408.

The thermally conductive release tabs 406, 408 may also include thermal insulators (or spacers) 420, 422 that occupy space between the conductive carrier 417 and the chassis 400. The thermal insulators 420, 422 are thermally insulative and sufficiently rigid to withstand an expected load from cold probes 426, 428 without substantial deflection. Gaps 430, 432 are depicted between the thermal insulators 420, 422 and the adhesive layer 418.

Once the cold probes 426, 428 have conducted sufficient thermal energy from the PSA 414 (primarily via the thermally conductive release tabs 406, 408, respectively) to lower the mean temperature of the PSA 414 to a level at or below that required to cause the PSA 414 to lose its tackiness and become brittle, the cold probes 426, 428 are moved away from the thermally conductive release tabs 406, 408, as illustrated by arrows 434, 436. Prior to the PSA 414 warming to a temperature above that required to cause the PSA 414 to lose its tackiness and become brittle (e.g., via thermal transfer of heat back into the PSA 414 from the relatively warmer chassis 400 and first component 402, and other surrounding components of the tablet computer), the first component 402 is pulled away from the chassis 400 and the PSA 414 fractures due to its brittleness and lack of tack in its cold temperature state, as illustrated by arrow 435.

More specifically, the chassis 400 may be secured within a fixture (not shown) and a suction device (also not shown) may be attached to a top surface of the first component 402. The suction device is then moved away from the chassis 400, pulling the first component 402 therewith. Upon fracture of the PSA 414, some or substantially all of the PSA 414 may remain attached to the chassis 400 and/or the first component 402. Further, the PSA 414 may remain substantially intact upon fracture (e.g., as shown) or the fracturing may separate the PSA 414 into multiple portions (e.g., fracturing primarily along interfaces between the conductive carrier 417 and the adhesive layers 416, 418).

While the tablet computer chassis 400 is illustrated in FIG. 4 and described in detail above, the PSA 414 with thermally conductive release tabs 406, 408, or other thermally conductive release tabs described herein, may be incorporated into a variety of other computing devices. Such computing devices may include batteries or other components adhered together using the PSA 414 having a variety of physical forms, including various sizes and shapes. Additional features of the chassis 400, first component 402 and/or PSA 414 may be as described above with reference to FIGS. 1-3, and/or elsewhere herein.

Figure 5:
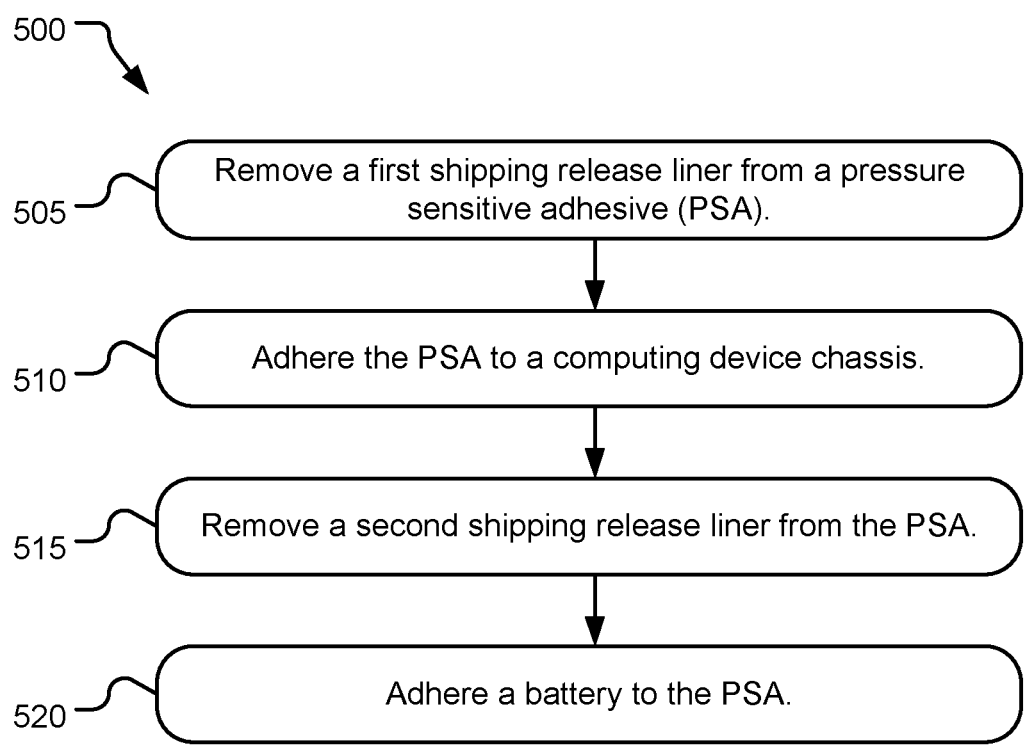
FIG. 5 illustrates example operations for adhering a battery to a computing device chassis using a PSA with thermally conductive release tabs.

FIG. 5 illustrates example operations 500 for adhering a battery to a computing device chassis using a PSA with thermally conductive release tabs. The PSA is at least a 3-layer construction, including two adhesive layers and a conductive carrier oriented therebetween. In general, a first adhesive layer serves to adhere a first component (e.g., the battery) to the conductive carrier, while the second adhesive layer serves to adhere a second component (e.g., the computing device chassis) to the conductive carrier. The conductive carrier serves as a conductive path for pulling thermal energy out of the PSA via the thermally conductive release tabs. The thermally conductive release tabs may also include thermal insulators (or spacers) that occupy space between the conductive carrier and the second component (when installed). In various implementations, the PSA may be shipped with two additional temporary release liners that protect the PSA from contamination and facilitate transport and handling prior to being used. The thermal insulators may also be held in place within the PSA by the temporary release liners.

In a first removing operation 505, a first one of the shipping release liners is removed from the PSA. In various implementations, the first shipping release liner is peeled away from the PSA exposing the second adhesive layer for adhesion. A first adhering operation 510 aligns and adheres the PSA to the chassis. The chassis has a predefined location for installation of the battery, which drives the alignment of the PSA. A predetermined amount of pressure is applied at a predetermined amount of time deemed sufficient to bond the PSA to the chassis.

In a second removing operation 515, a second one of the shipping release liners is removed from the PSA. In various implementations, the second shipping release liner is peeled away from the remaining exposed side of the PSA thereby exposing the first adhesive layer for adhesion. A second adhering operation 520 aligns and adheres the battery to the PSA. A predetermined amount of pressure is applied at a predetermined amount of time deemed sufficient to bond the PSA to the chassis and the battery.

In other implementations, the PSA is first applied to the battery, and then the battery with the PSA attached is adhered to the chassis. Further, the thermal insulators may be placed on the chassis or the battery independently and prior to adhering the PSA to the chassis, battery, and thermal insulators. In implementations where the thermal insulators are independently placed, the PSA may include mock-up spacers between the temporary release liners to avoid damaging the thermally conductive release tabs transport and handling.

Figure 6:
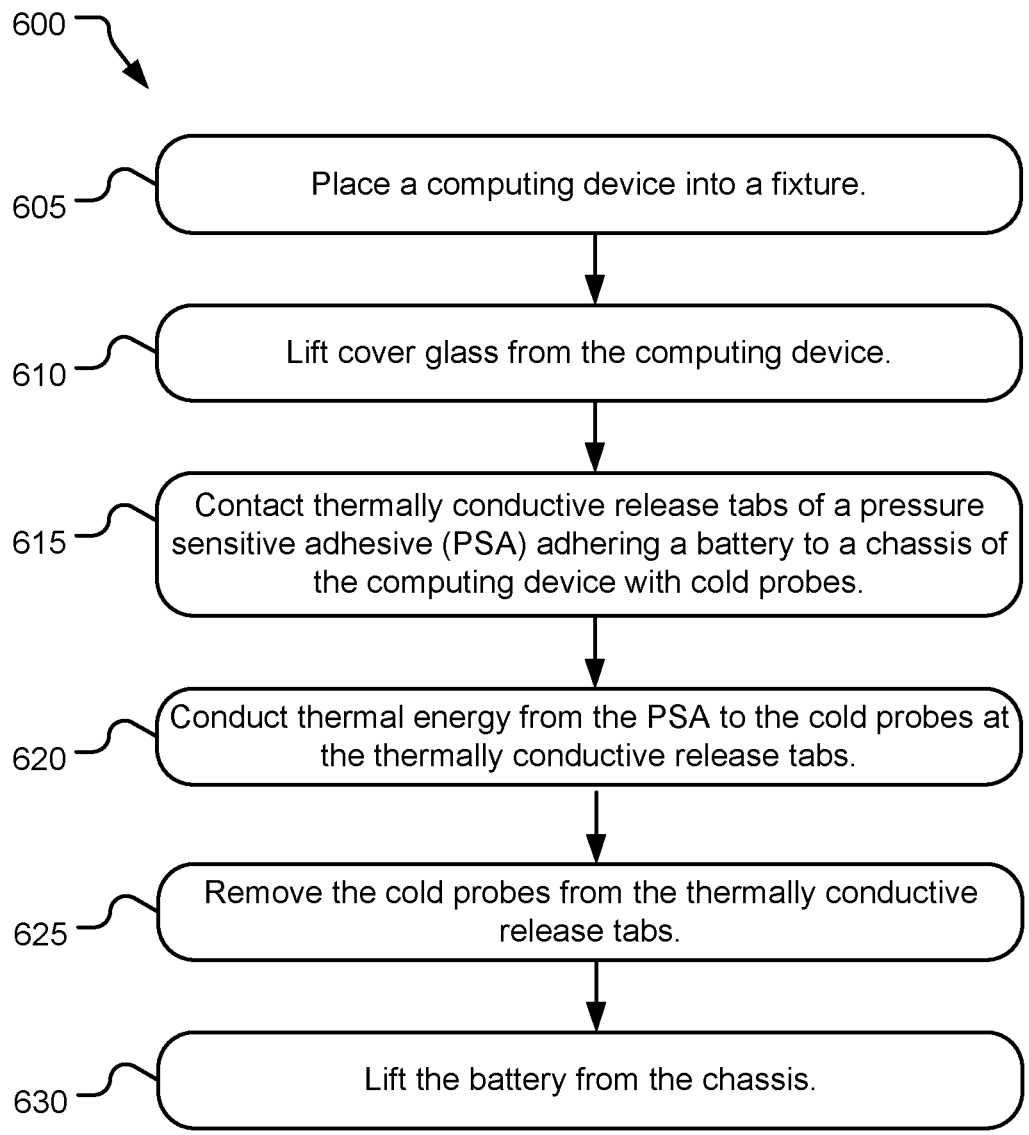
FIG. 6 illustrates example operations for removing a battery from a computing device chassis using a PSA with thermally conductive release tabs.

FIG. 6 illustrates example operations 600 for removing a battery from a computing device chassis using a PSA with thermally conductive release tabs. A placing operation 605 places the computing device into a fixture. The fixture may be a component of a specific machine adapted to disassemble computing devices or the fixture may be any stable structure that secures the tablet computer in a fixed location. The fixture may utilize one or more of suction pressure, clamps, mechanical fasteners, and adhesives to secure the chassis to the fixture.

A first lifting operation 610 lifts the cover glass from the computing device chassis. The lifting mechanism may also be a component of the machine adapted to disassemble computing devices, or the lifting mechanism may be any structure that securely and uniformly attaches to the cover glass without damaging the cover glass. The lifting mechanism may also utilize one or more of suction pressure, clamps, mechanical fasteners, and adhesives to secure the cover glass to the lifting mechanism.

A contacting operation 615 contacts thermally conductive release tabs of the PSA with cold probes. The PSA is at least a 3-layer construction, including two adhesive layers and a conductive carrier oriented therebetween. In general, a first adhesive layer adheres a first component (e.g., the battery) to the conductive carrier, while the second adhesive layer adheres a second component (e.g., the computing device chassis) to the conductive carrier. The conductive carrier serves as a conductive path for pulling thermal energy out of the PSA via the thermally conductive release tabs. The thermally conductive release tabs may also include thermal insulators (or spacers) that occupy space between the conductive carrier and the second component and prevent the cold probes from substantially deflecting the conductive carrier at the thermally conductive release tabs upon contact.

A conducting operation 620 conducts thermal energy from the PSA to the cold probes at the thermally conductive release tabs. More specifically, the cold probes are maintained at a temperature below that required to cause the PSA to lose its tackiness and become brittle, even considering an expected rate of thermal transfer of heat back into the PSA from the relatively warmer chassis and battery, and other surrounding components of the computing device. A removing operation 625 removes the cold probes from the thermally conductive release tabs once they have conducted sufficient thermal energy from the PSA to lower the mean temperature of the PSA to a level at or below that required to cause the PSA to lose its tackiness and become brittle.

A second lifting operation 630 lifts the battery from the chassis. Prior to the PSA warming to a temperature above that is required to cause the PSA to lose its tackiness and become brittle, the battery is pulled away from the chassis and the PSA fractures due to its brittleness and lack of tack in its cold temperature state. As with the first lifting operation 610, the lifting mechanism may also be a component of the machine adapted to disassemble computing devices, or the lifting mechanism may be any structure that securely and uniformly attaches to the battery without damaging the battery. The lifting mechanism may also utilize one or more of suction pressure, clamps, mechanical fasteners, and adhesives to secure the battery to the lifting mechanism. The lifting mechanism moves away from the fixture to fracture the PSA and remove the battery from the chassis cleanly and without damaging nearby components. In some implementations a replacement battery may be reinstalled in the chassis using operations 500 of FIG. 5, for example.

The logical operations described herein may be performed in any order, adding or omitting operations as desired, unless explicitly claimed otherwise or a specific order is inherently necessitated by the claim language.

An example pressure sensitive adhesive according to the presently disclosed technology comprises a first adhesive layer, a second adhesive layer, and a thermally conductive carrier. The thermally conductive carrier is oriented between the first adhesive layer and the second adhesive layer and includes a first conductive tab extending beyond a perimeter of at least one of the first adhesive layer and the second adhesive layer.

In another example pressure sensitive adhesive according to the presently disclosed technology, the first conductive tab includes a thermally insulating spacer oriented in a same plane as the second adhesive layer.

In another example pressure sensitive adhesive according to the presently disclosed technology, the thermally insulating spacer includes a plastic structure distinct from the second adhesive layer.

In another example pressure sensitive adhesive according to the presently disclosed technology, the thermally insulating spacer includes multiple sublayers of thermally insulating and adhesive materials.

In another example pressure sensitive adhesive according to the presently disclosed technology, the thermally insulating spacer is an extension of the second adhesive layer into the first conductive tab.

In another example pressure sensitive adhesive according to the presently disclosed technology, the thermally conductive carrier includes one or both of graphite and graphene.

In another example pressure sensitive adhesive according to the presently disclosed technology, the thermally conductive carrier includes a second conductive tab extending beyond the perimeter of at least one of the first adhesive layer and the second adhesive layer.

In another example pressure sensitive adhesive according to the presently disclosed technology, the first conductive tab further extends beyond a perimeter of a first component to be adhered to a second component.

In another example pressure sensitive adhesive according to the presently disclosed technology, the first component is a battery and the second component is a computing device chassis.

In another example pressure sensitive adhesive according to the presently disclosed technology, one or both of the first adhesive layer and the second adhesive layer includes multiple sublayers of adhesive and carrier materials.

In another example pressure sensitive adhesive according to the presently disclosed technology, the thermally conductive carrier includes multiple sublayers of conductive and binding materials.

An example method of disassembling a computing device according to the presently disclosed technology comprises contacting a first conductive tab of a pressure sensitive adhesive adhering a first component to a second component with a cold probe, conducting thermal energy from the pressure sensitive adhesive to the cold probe at the first conductive tab, and lifting the first component from the second component. The pressure sensitive adhesive comprises a first adhesive layer, a second adhesive layer, and a thermally conductive carrier oriented between the first adhesive layer and the second adhesive layer. The first conductive tab extends beyond a perimeter of at least one of the first adhesive layer and the second adhesive layer.

Another example method of disassembling a computing device according to the presently disclosed technology further comprises removing the cold probe from the first conductive tab prior to lifting the first component from the second component.

In another example method of disassembling a computing device according to the presently disclosed technology, conducting thermal energy from the pressure sensitive adhesive to the cold probe freezes one or both of the first adhesive layer and the second adhesive layer.

In another example method of disassembling a computing device according to the presently disclosed technology, the first component is a battery and the second component is a computing device chassis.

In another example method of disassembling a computing device according to the presently disclosed technology, the pressure sensitive adhesive fractures in response to the lifting of the first component from the second component.

An example computing device according to the presently disclosed technology comprises a first component, a second component, and a pressure sensitive adhesive. The pressure sensitive adhesive is oriented between the first component and the second component and adheres the first component to the second component. The pressure sensitive adhesive comprises a first adhesive layer, a second adhesive layer, and a thermally conductive carrier. The thermally conductive carrier is oriented between the first adhesive layer and the second adhesive layer and includes a first conductive tab extending beyond a perimeter of the first component.

In another example computing device according to the presently disclosed technology, the first component is a battery and the second component is a computing device chassis.

In another example computing device according to the presently disclosed technology, the first conductive tab includes a thermally insulating spacer oriented in a same plane as the second adhesive layer.

In another example computing device according to the presently disclosed technology, the thermally conductive carrier includes a second conductive tab extending beyond the perimeter of the first component.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A pressure sensitive adhesive comprising:
   a first adhesive layer;
   a second adhesive layer; and
   a thermally conductive carrier oriented between the first adhesive layer and the second adhesive layer, the thermally conductive carrier including a first conductive tab extending beyond a perimeter of at least one of the first adhesive layer and the second adhesive layer, the first conductive tab including a structurally rigid plastic thermally insulating spacer existing as a distinct element from the second adhesive layer but oriented in a same plane as the second adhesive layer.

2. The pressure sensitive adhesive of claim 1, wherein the thermally insulating spacer includes multiple sublayers of thermally insulating and adhesive materials.

3. The pressure sensitive adhesive of claim 1, wherein the thermally insulating spacer further includes an adhesive layer.

4. The pressure sensitive adhesive of claim 1, wherein the thermally conductive carrier includes one or both of graphite and graphene.

5. The pressure sensitive adhesive of claim 1, wherein the thermally conductive carrier includes a second conductive tab extending beyond the perimeter of at least one of the first adhesive layer and the second adhesive layer.

6. The pressure sensitive adhesive of claim 1, wherein the first conductive tab further extends beyond a perimeter of a first component to be adhered to a second component.

7. The pressure sensitive adhesive of claim 6, wherein the first component is a battery and the second component is a computing device chassis.

8. The pressure sensitive adhesive of claim 1, wherein one or both of the first adhesive layer and the second adhesive layer includes multiple sublayers of adhesive and carrier materials.

9. The pressure sensitive adhesive of claim 1, wherein the thermally conductive carrier includes multiple sublayers of conductive and binding materials.

10. The pressure sensitive adhesive of claim 1, wherein one or both of the first adhesive layer and the second adhesive layer become brittle when cooled to a temperature below a low temperature threshold.

11. A method of disassembling a computing device comprising:
    contacting a first conductive tab of a pressure sensitive adhesive adhering a first component to a second component with a cold probe, the pressure sensitive adhesive comprising:
      a first adhesive layer;
      a second adhesive layer; and
      a thermally conductive carrier oriented between the first adhesive layer and the second adhesive layer, the first conductive tab extending beyond a perimeter of at least one of the first adhesive layer and the second adhesive layer, the first conductive tab including a structurally rigid plastic thermally insulating spacer existing as distinct element from the second adhesive layer but oriented in a same plane as the second adhesive layer;
    conducting thermal energy from the pressure sensitive adhesive to the cold probe at the first conductive tab; and
    lifting the first component from the second component.

12. The method of claim 11, further comprising:
    removing the cold probe from the first conductive tab prior to lifting the first component from the second component.

13. The method of claim 11, wherein the conducting thermal energy from the pressure sensitive adhesive to the cold probe freezes one or both of the first adhesive layer and the second adhesive layer.

14. The method of claim 11, wherein the first component is a battery and the second component is a computing device chassis.

15. The method of claim 11, wherein the pressure sensitive adhesive fractures in response to the lifting of the first component from the second component.

16. A computing device comprising:
    a first component;

a second component; and a pressure sensitive adhesive oriented between the first component and the second component and adhering the first component to the second component, wherein the pressure sensitive adhesive comprises:
- a first adhesive layer;
- a second adhesive layer; and
- a thermally conductive carrier oriented between the first adhesive layer and the second adhesive layer, the thermally conductive carrier including a first conductive tab extending beyond a perimeter of the first component, the first conductive tab including a structurally rigid plastic thermally insulating spacer existing as a distinct element from the second adhesive layer but oriented in a same plane as the second adhesive layer.

17. The computing device of claim 16, wherein the first component is a battery and the second component is a computing device chassis.

18. The computing device of claim 16, wherein the thermally conductive carrier includes a second conductive tab extending beyond the perimeter of the first component.

19. The computing device of claim 16, wherein one or both of the first adhesive layer and the second adhesive layer become brittle when cooled to a temperature below a low temperature threshold.

* * * * *